United States Patent [19]

Harada

[11] Patent Number: 5,264,381
[45] Date of Patent: *Nov. 23, 1993

[54] METHOD OF MANUFACTURING A STATIC INDUCTION TYPE SWITCHING DEVICE

[75] Inventor: Masana Harada, Itami, Japan

[73] Assignee: Mitsubishi Denki Kabushiki Kaisha, Tokyo, Japan

[*] Notice: The portion of the term of this patent subsequent to Sep. 1, 2009 has been disclaimed.

[21] Appl. No.: 854,096

[22] Filed: Mar. 19, 1992

Related U.S. Application Data

[60] Continuation of Ser. No. 518,300, May 2, 1990, Pat. No. 5,143,859, which is a division of Ser. No. 356,054, May 23, 1989, abandoned.

[30] Foreign Application Priority Data

Jan. 18, 1989 [JP] Japan .................... 1-9014

[51] Int. Cl.⁵ .................... H01L 21/265
[52] U.S. Cl. .................... 437/40; 437/911; 437/160; 437/162; 437/203; 437/97
[58] Field of Search ............... 357/22 C, 23.11, 23.14, 357/38, 229, 22 E, 59 G, 59 K, 95, 97, 162; 437/160, 162, 40, 203, 911

[56] References Cited

U.S. PATENT DOCUMENTS

| | | | |
|---|---|---|---|
| 3,363,153 | 1/1968 | Zloezower | 357/235 |
| 3,855,608 | 12/1974 | George | 437/911 |
| 3,938,241 | 2/1976 | George | 437/911 |
| 3,977,017 | 8/1976 | Ishitani | 357/22 |
| 4,216,038 | 8/1980 | Nishizawa et al. | 148/187 |
| 4,284,998 | 8/1981 | Fuse et al. | 357/22 |
| 4,375,124 | 3/1983 | Cogan | 437/79 |
| 4,476,622 | 10/1984 | Cogan | 437/911 |
| 4,505,022 | 3/1985 | Briere | 437/911 |
| 4,512,074 | 4/1985 | Sasaki | 29/576 W |
| 4,569,701 | 2/1986 | Oh | 148/188 |
| 4,583,282 | 4/1986 | Hulseweh | 29/576 W |
| 4,604,150 | 8/1986 | Lin | 437/162 |
| 4,646,123 | 2/1987 | Lynch et al. | 357/42 |
| 4,654,688 | 3/1987 | Fukushima | 357/46 |
| 4,666,556 | 5/1987 | Fulton | 357/55 |
| 4,676,847 | 6/1987 | Lin | 437/162 |
| 4,713,358 | 12/1987 | Bulat | 437/911 |
| 4,841,350 | 6/1989 | Nishizawa | 357/38 |
| 4,845,051 | 7/1989 | Cogan | 437/203 |

FOREIGN PATENT DOCUMENTS

| | | | |
|---|---|---|---|
| 0018751 | 1/1987 | Japan | 27/10 |
| 0104464 | 5/1988 | Japan | 27/10 |
| 0169759 | 7/1988 | Japan | 27/10 |
| 0147481 | 12/1988 | Japan | 27/4 |
| 2026237 | 1/1980 | United Kingdom | 29/80 |

OTHER PUBLICATIONS

Nishizawa et al., "Field-Effect Transistor Versus Analog Transistor (Static Induction Transistor)"; IEEE Transactions on Electron Devices, vol. ED-22, No. 4, Apr. 1975.

Wessels et al., "Vertical Channel Field—Controlled Thyristors With High Gain and Fast Switching Speeds"; IEEE Transaction on Electron Devices, vol. ED-25; No. 10, Oct. 1978.

Primary Examiner—Brian E. Hearn
Assistant Examiner—Trung Dang
Attorney, Agent, or Firm—Oblon, Spivak, McClelland, Maier & Neustadt

[57] ABSTRACT

In a static induction type switching device having gate regions buried in a semiconductor substrate, the gate regions are formed by polysilicon layers and diffusion layers which can be formed by diffusion from the polysilicon layers serving as diffusion sources. Therefore, dimensional accuracy, electric properties etc. can be improved such that channel regions can be accurately defined between the gate regions in the semiconductor substrate, and the channel regions can be formed through use of the semiconductor substrate etc.

1 Claim, 9 Drawing Sheets

METHOD OF MANUFACTURING A STATIC INDUCTION TYPE SWITCHING DEVICE

This application is a continuation application of U.S. patent application Ser. No. 07/518,300 and which was filed on May 2, 1990 now U.S. Pat. No. 5,143,859. U.S. patent application Ser. No. 07/518,300 is a divisional application filed under the provisions of 37 CFR §1.62 of U.S. patent application Ser. No. 07/356,054 filed May 23, 1989 now abandoned.

BACKGROUND OF THE INVENTION

1. Field of the Invention

The present invention relates to a static induction type switching device having gate regions which are buried in a semiconductor substrate and a method of manufacturing the same.

2. Description of the Prior Art

FIG. 1 is a sectional view showing the gate structure of a conventional static induction type switching device (hereinafter referred to as "SI device") having buried gate structure such as a static induction type transistor (hereinafter referred to as "SI transistor"), a static induction type thyristor (hereinafter referred to as "SI thyristor") or the like. Referring to FIG. 1, $p^+$-type gate regions 5 (5a and 5b) are formed in an upper layer part of an $n^-$-type substrate 1 by selective impurity diffusion. An n-type epitaxial layer 2 is formed on a region 1a of the $n^-$-type substrate 1, to bury the $p^+$-type gate regions 5a. Thus, channel regions 8 are defined by portions of the $n^-$-type substrate 1 and the epitaxial layer 2 located between the $p^+$-type gate regions 5.

Gate metal electrodes 3 are formed on the $p^+$-type gate regions 5b. An $n^+$-type cathode region 4 is formed on the n-type epitaxial layer 2, and a cathode metal electrode 6 is formed on the $n^+$-type cathode region 4. The gate metal electrodes 3 are insulated from the n-type epitaxial layer 2, the $n^+$-type cathode region 4 and the cathode metal electrode 6 by insulating films 7 which are formed on end portions of the n-type epitaxial layer 2 and the $n^+$-type cathode region 4. The $p^+$-type gate regions 5 are connected with each other by impurity diffusion layers formed in a section different from that shown in FIG. 1.

FIG. 2 is a sectional view showing the gate structure of an SI device having surface gate structure. Referring to FIG. 2, $p^+$-type gate regions 5 are deeply formed in an upper layer part of an $n^-$-type substrate 1 by selective impurity diffusion. An $n^-$-type cathode region 4 is also formed in the upper layer part of the $n^-$-type substrate 1 between the $p^+$-type gate regions 5 by selective impurity diffusion, to be smaller in depth than the $p^+$-type gate regions 5. Thus, a channel region 8 is defined between the $p^+$-type gate regions 5, in a deep portion provided with no $n^+$-type cathode region 4.

Gate metal electrodes 3 are formed on the $p^+$-type gate regions 5 and a cathode metal electrode 6 is formed on the $n^+$-type cathode region 4 respectively, so that these electrodes 3 and 6 are insulated from each other by insulating films 7.

FIG. 3 is a sectional view showing the gate structure of an SI device having trench gate structure. Referring to FIG. 3, a large number of trenches are formed in an $n^-$-type substrate 1. Under these trenches, $p^+$-type gate regions 5 are defined by diffusing an impurity from bottom portions of the trenches. On the other hand, $n^+$-type cathode regions 4 are formed on upper layer parts by impurity diffusion. Thus, channel regions 8 are defined between the $p^+$-type gate regions 5.

Gate metal electrodes 3 are formed on the $p^+$-type gate regions 5 and cathode metal electrodes 6 are formed on the $n^+$-type cathode regions 4, so that the gate metal electrodes 3 and the cathode metal electrodes 6 are insulated from each other by insulating films 7 which are formed in stepped portions.

While the gate metal electrodes 3 shown in FIG. 3 are adapted to serve as interconnection members, such gate metal electrodes 3 may be omitted to alternatively make gate impurity diffusion layers, i.e., the $p^+$-type gate regions 5 themselves serve as gate interconnection members.

When reverse bias voltage is applied between the gate metal electrodes 3 and the cathode metal electrode(s) 6 in case of a normally-on type SI device having the structure shown in FIG. 1, 2 or 3, main current flowing in the channel region(s) 8 is cut off by rising potential barrier caused in the channel region(s) 8 and extracting excessive minority carriers from the gate metal electrodes 3 at the same time, whereby the SI device enters an OFF state. When zero or positive bias is applied across gates and cathodes on the other hand, the potential barrier in the channel region(s) 8 is reduced, so that the main current flows in the channel region(s) 8, whereby the SI device enters an ON state.

Characteristics relating to on/off operation of the SI device in the aforementioned manner extremely depend on the gate structure. In order to quickly extract the minority carriers for achieving high-speed turn-off operation, resistance of the $p^+$-gate regions 5 must be reduced to the minimum.

Further, the SI device having a high breakdown voltage between the gates and the cathodes is also required, since the speed of turn-off operation and the amount of current which can be blocked depend on a breakdown voltage between the gates and the cathodes (the amount of applicable reverse bias).

On the other hand, the main current flows in the channel region(s) 8, and hence it is necessary to precisely control channel width and channel length, which are almost determined in formation of the $p^+$-type gate regions 5 by impurity diffusion, in order to improve on-off characteristics.

In addition to the aforementioned improvement of switching characteristics, increase in channel number is desired and refinement of the gate structure is demanded in order to reduce ON voltage.

As hereinabove described, the conventional SI devices are mainly of three types of the buried gate structure, the surface gate structure and the trench gate structure.

In the SI device of the buried gate structure shown in FIG. 1, a breakdown reverse voltage between the gates and the cathodes can be increased since the $p^+$-gate regions 5 are buried, and this device is advantageous for pressure-contact type packaging due to its structure.

However, it is difficult to form the n-type epitaxial layer 2 in good quality since generation of defects and autodoping from the $p^+$-gate regions 5 of high concentration must be suppressed in formation of the n-type epitaxial layer 2. Thus, the impurity concentration profile of the channel region 8 is deteriorated as compared with those of the surface gate structure and the trench gate structure shown in FIGS. 2 and 3, which are formed only by the $n^-$-type substrates 1. Further, it is difficult to accurately form the channel width and channel length of the channel region 8, due to floating of the impurity from the p+-type gate regions 5 in formation of the n-type epitaxial layer 2, etc.

On the other hand, the SI device of the surface gate structure shown in FIG. 2 is easy to manufacture. However, it is difficult to set a breakdown reverse voltage at a high value since the p+-type gate regions 5 are formed in the surface of the n⁻-type substrate 1 and high electric field is easily caused in p-n junction portions on the surface of the n⁻-type substrate 1. Thus, it is impossible to increase the amount of current which can be blocked in turn-off operation.

In the SI device of the trench gate structure shown in FIG. 3, the p+-type gate regions 5 can be deeply formed similarly to the SI device of the buried gate structure since the same are formed by impurity diffusion from the bottom portions of the trenches, whereby the breakdown reverse voltage can be high.

In this SI device, the p+-type gate regions 5 are formed through general ion implantation or doping with a gas containing an impurity at a high temperature after formation of the trenches. In the step of forming the p+-gate regions 5, it is necessary to prevent diffusion of the p-type impurity toward the side surfaces of the trenches, in order to improve a breakdown reverse voltage between the gates and the cathodes. Therefore, when impurity diffusion of high concentration is performed for forming the p+-type gate regions, it is necessary to previously largely etch the side surfaces to increase width of the trenches, thereby to prevent diffusion of the impurity toward the side surfaces of the trenches. Such countermeasure is improper for refinement. In other words, impurity concentration of the p+-type gate regions 5 cannot be increased when refinement is desired.

Further, sufficient trench width is also required in order to prevent short-circuiting across the gate metal electrodes 3 and the cathode metal electrodes 6, and hence it is difficult to refine gate patterns and cathode patterns. In addition, the SI device of the trench gate structure is basically of surface interconnection structure, and hence it is improper to apply this SI device to a pressure-contact type device, since there is the possibility that a sufficient insulation distance cannot be maintained. Although there is the one which performs no interconnection by the gate metal electrodes 3 in this structure as hereinabove described, another problem is caused in this case, such that gate resistance cannot be sufficiently reduced.

SUMMARY OF THE INVENTION

The present invention is intended for a static induction type switching device.

According to the present invention, the device comprises: (a) a first conductivity type semiconductor substrate having top and bottom major surfaces; (b) gate regions which are buried in the semiconductor substrate and are arrayed substantially in the top major surface, each of the gate regions comprising (b-1) a polysilicon region having second conductivity type impurities and (b-2) a second conductivity type diffused region formed on periphery of the polysilicon region, portions of the semiconductor substrate between the gate regions being defined as channel regions; (c) a first conductivity type first main electrode region formed on the top major surface above the channel regions; (d) a first or second conductivity type second main electrode region formed on the bottom major surface; and (e) insulation regions formed between the gate regions and the main electrode region.

The diffused region has second conductivity type impurities which are diffused from the polysilicon region.

In the embodiment of the present invention, the insulation region are provided in respective trenches which are defined in the top major surface and are arrayed on the gate regions.

The present invention is also intended for a method of manufacturing a static induction type switching device.

According to the present invention, the method comprises the steps of: (a) preparing a first conductivity type semiconductor substrate having top and bottom major surfaces; (b) forming a first conductivity type region on the top major surface of the semiconductor substrate; (c) selectively etching the first conductivity type region and the semiconductor substrate to thereby define first trenches which are arrayed substantially in the top major surface; (d) forming polysilicon regions containing second conductivity type impurities in bottom portions of the first trenches; (e) diffusing the second conductivity type impurities from the polysilicon layers serving as diffusion sources to thereby form diffused regions on peripheries of the polysilicon regions, the diffused regions serving as gate regions with the polysilicon regions; and (f) forming a first or second conductivity type second main electrode region on the bottom major surface of the semiconductor substrate.

Preferably, the step (d) includes the steps of: (d-1) providing a material substantially made of polysilicon having second conductivity impurities into each of the first trenches, and (d-2) removing a top portion of the material from each of the first trenches, to thereby obtain the polysilicon regions.

The step (d-2) may include the step of: (d-21) from each of the first trenches, removing the top portion of the material together with respective parts of the semiconductor substrate and the first conductivity type region which surround the top portion of the material, to thereby define second trenches with which respective entrance side portions of the first trenches are replaced, respectively, wherein an aperture size of each second trench is larger than an aperture size of each first trench.

In the embodiment of the present invention, the step further comprises: (g) providing an insulator into each of the second trenches.

According to the present invention, gate regions are formed by polysilicon regions buried in a semiconductor substrate and containing second conductivity type impurities and diffused regions which can be formed by diffusion of the second conductivity type impurities from the polysilicon regions serving as diffusion sources, whereby channel regions can be formed in high accuracy in portions of the semiconductor substrate between the gate regions.

Accordingly, an object of the present invention is to obtain a static induction type switching device having high breakdown reverse voltage between gates and cathodes.

Another object is to form entire channel regions through use of a semiconductor substrate while controlling channel length and channel width of the channel regions in high accuracy.

Further another object is to have low gate resistance.

Further another object is to have a static induction type switching device.

Another object is to provide a method of manufacturing the device having these characters suitable for refinement.

These and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 4A to 4G are sectional views showing a method of manufacturing an SI device according to an embodiment of the present invention. The manufacturing method is now described with reference to these figures.

Figure 4A:
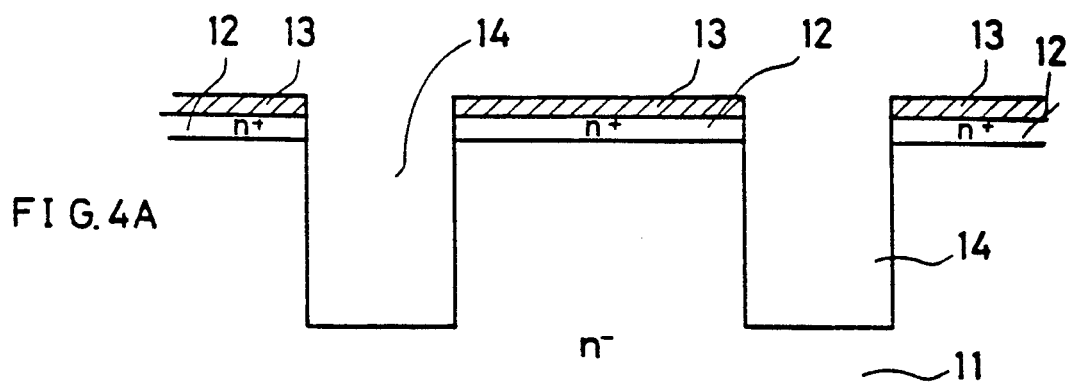
FIGS. 4A to 4G are sectional views showing a method of manufacturing an SI device according to an embodiment of the present invention.

First, an n+-type cathode region 12 is formed over the entire upper surface of an n−-type substrate 11 by impurity diffusion, and an oxide film 13 is formed on the n+-type cathode region 12 by thermal oxidation. A resist film is applied onto the oxide film 13, and is thereafter patterned. Then the resist film is employed as a mask, to selectively etch the n+-type cathode region 12 and the oxide film 13. Thereafter the patterned oxide film is again employed as a mask to anisotropically etch the n−-type substrate 11, thereby to form trenches 14 as shown in FIG. 4A.

Figure 4B:
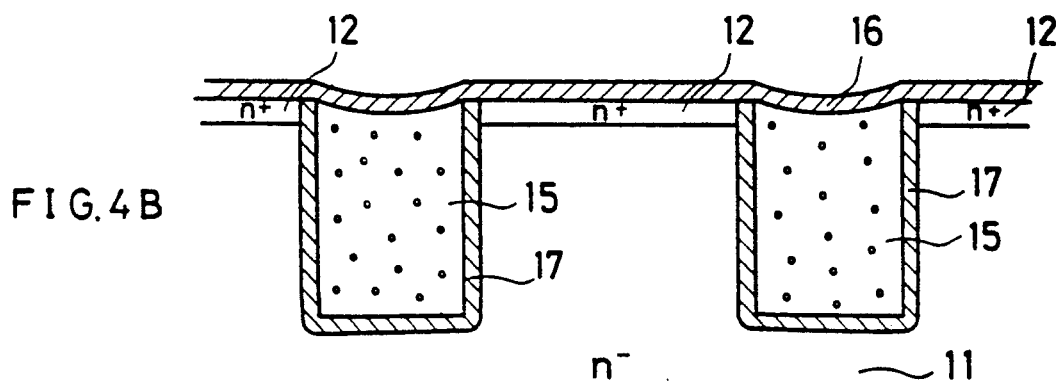

Then, the so-called doped polysilicon members 15 containing p-type impurities at high concentration are buried in the trenches 14, as shown in FIG. 4B. The surface is flattened and thereafter a thermal oxide film 16 is formed over the entire upper surface of the n−-type substrate 1 including the doped polysilicon members 15. At the same time, p+-type diffusion layers 17 are formed on outer peripheries of the polysilicon members 15 by thermal diffusion from the polysilicon members 15, serving as diffusion sources.

Figure 4C:
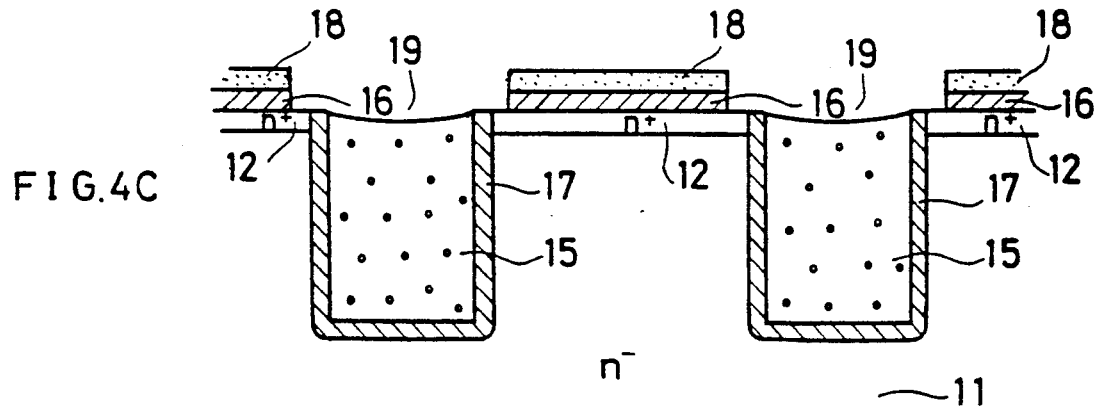

A resist film 18 is applied onto the oxide film 16, and is patterned in regions including upper layer parts of the doped polysilicon members 15 and being wider by 2 to 3 μm. Thereafter the resist film 18 is employed as a mask for performing etching, thereby to define openings 19 which are wider than the upper surfaces of the doped polysilicon members 15, as shown in FIG. 4C.

Figure 4D:
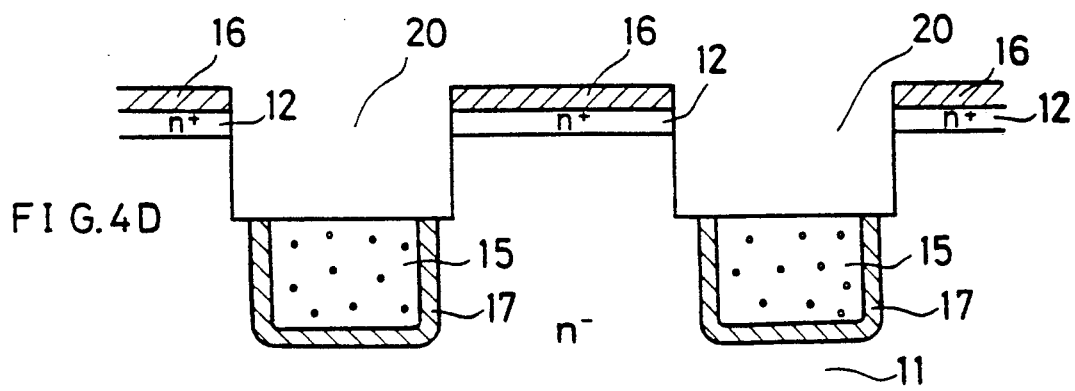

Then, the patterned oxide film 16 employed as a mask to anisotropically etch the doped polysilicon members 15, the n+-type cathode region 12 and the p+-type diffusion layers 17, thereby to form trenches 20 having openings wider than the upper surfaces of the doped polysilicon members 15 and being smaller in depth than the trenches 14. As the result, parts of the doped polysilicon members 15 and the p+-type diffusion layers 17 are removed from the trenches 20, as shown in FIG. 4D.

Figure 4E:
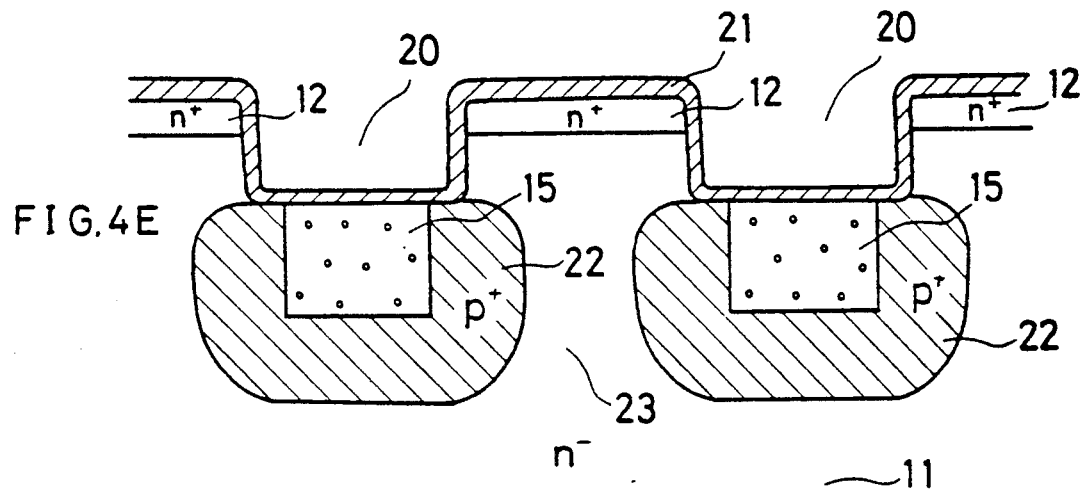

Then, thermal oxidation is performed over the entire surface of the n−-type substrate 11 including the trenches 20, to cover the same with an oxide film 21. Further, p+-type gate regions 22 are formed as shown in FIG. 4E, through impurity diffusion from the doped polysilicon members 15, serving as diffusion sources, by heat treatment. At the same time, a channel region 23 is formed to have desired channel width and channel length.

Figure 4F:
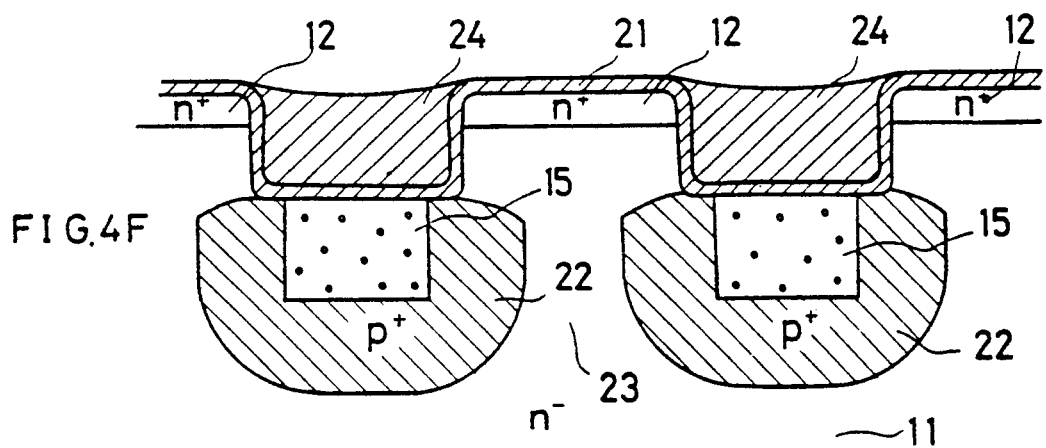
Figure 4G:
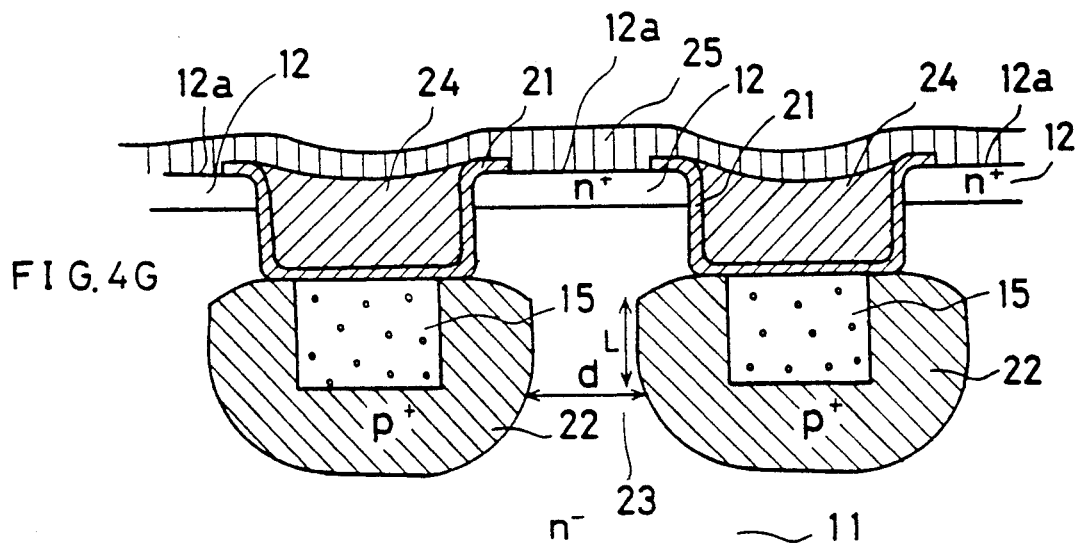
Figure 5:
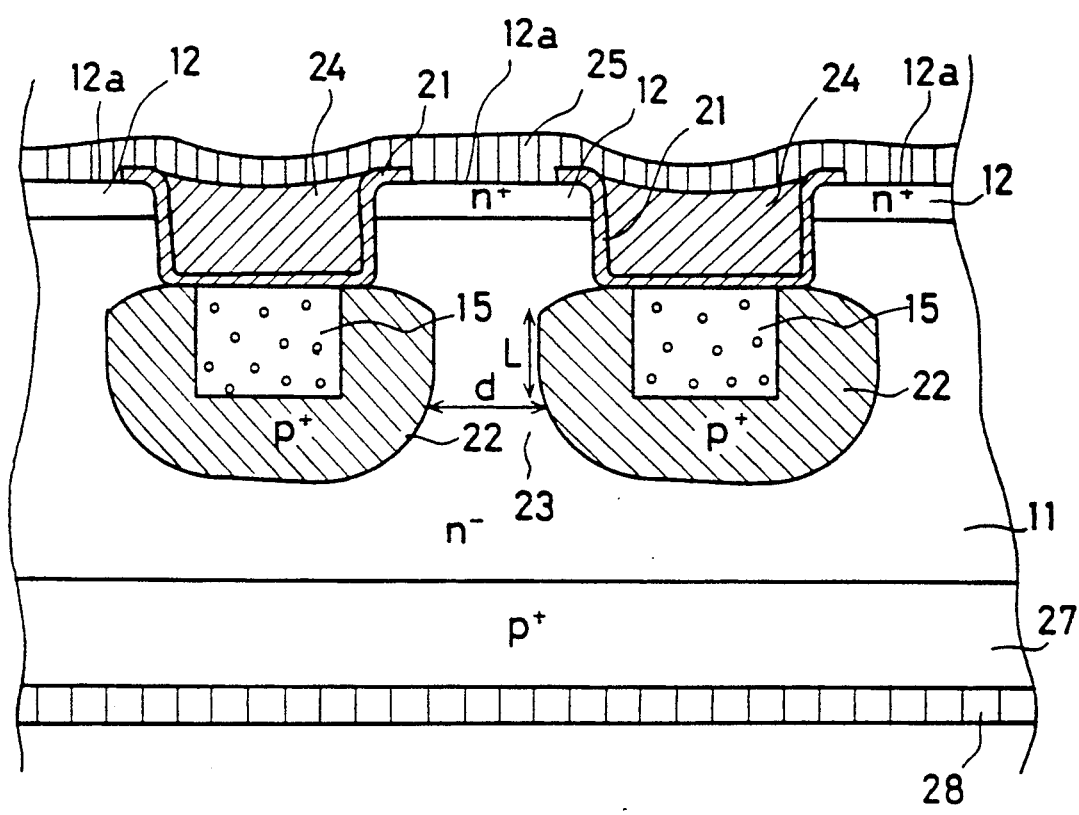
FIG. 5 is a sectional view showing an SI thyristor.

Insulating materials 24 are buried in the trenches 20 by CVD or the like, to flatten the surface as shown in FIG. 4F. Further, parts of the oxide film 21 located on the n+-type cathode region 12 are selectively etched to expose surface parts of the n+-type cathode region 12, thereby to define cathode contact regions 12a. Thereafter a cathode metal electrode 25 is formed to be electrically connected to the n+-type cathode region 12 through the cathode contact regions 12a, as shown in FIG. 4G. As the result, gate and cathode regions of the SI device in this embodiment are completed. Then, a p+-type anode region 27 is formed on the underside of the n−-type substrate 11 by impurity diffusion to form an anode metal electrode 28 on the p+-type anode region 27, thereby to complete an SI thyristor as shown in FIG. 5. The p+-type anode region 27 may be replaced by an n+-type anode region, to provide an SI transistor.

Figure 6:
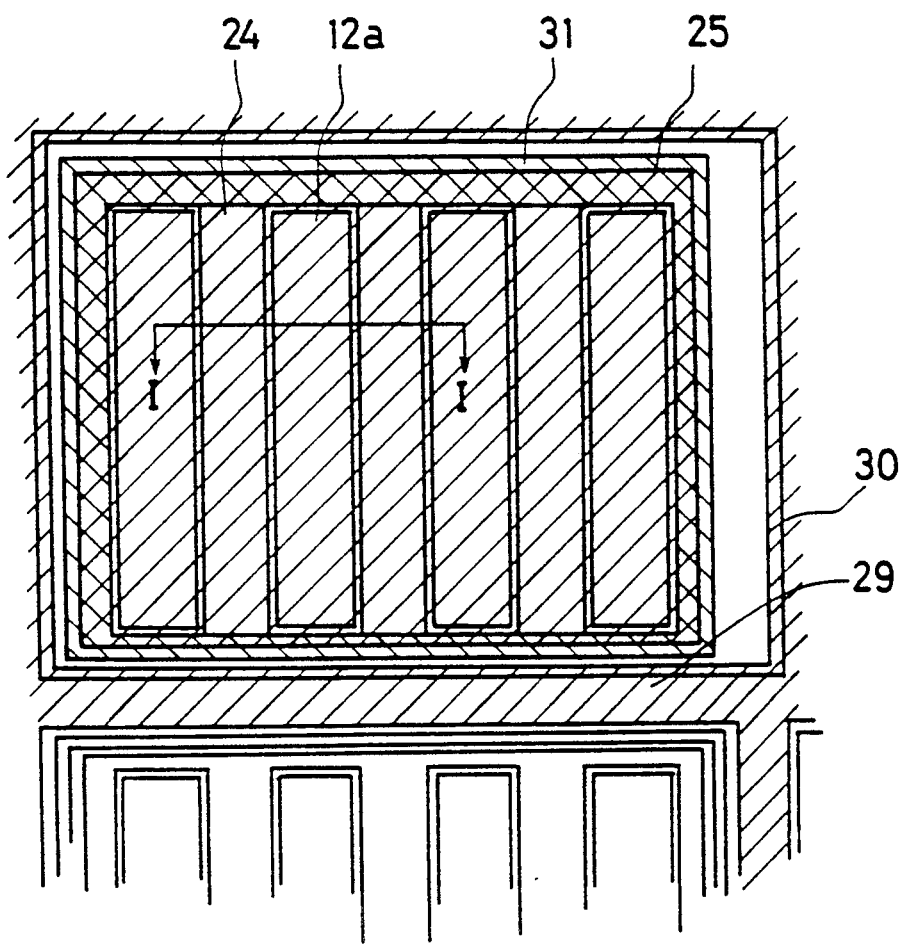
FIG. 6 is a top view showing the SI device according to the embodiment shown in FIG. 4.

FIG. 6 is a plan view showing the SI device according to this embodiment. Referring to FIG. 6, numeral 29 indicates a gate contact region which is electrically connected with the p+-type gate regions 22 through an impurity diffusion layer (not shown), and a gate metal electrode 30 is formed on the gate contact region 29. Numeral 31 indicates an insulating film, which is formed under the cathode metal electrode 25. The sectional views shown in FIGS. 4A to 4G are taken along the line I—I in this plan view.

Thus, the p+-type gate regions 22 of the SI device according to this embodiment are formed by thermal diffusion from the doped polysilicon members 15 formed in the n−-type substrate 11 and serving as diffusion sources. Therefore, dimensional accuracy is improved as follows:

First, thickness of the p+-type gate regions 22 can be easily controlled by changing impurity concentration of the doped polysilicon members 15 and thermal diffusion condition. Therefore, channel width d between each pair of adjacent p+-type gate regions 22 can be accurately controlled in a range of 2 to 5 μm (optimum width in a normalion type SI device) through thermal diffusion from the doped polysilicon members 15, serving as diffusion sources, by setting the interval between each pair of adjacent trenches 14 in a range of 10 to 20 μm.

In a general SI device, the ratio of constant voltage which can be blocked by gate voltage to the said gate voltage is decided as follows:

$$\mu \alpha L \times L_{GA}/d^2$$

where d represents channel width (see FIG. 4G), L represents channel length (see FIG. 4G) and $L_{GA}$ represents thickness of a depletion layer extending from a gate to an anode in an OFF state. As such blocking gain μ is increased, the device is rendered suitable for high power application.

The channel length L is determined by depth of the finally left doped polysilicon members 15. Therefore, desired channel length L can be obtained by appropriately setting depth values of the trenches 14 and 20. For example, channel length L of about 5 μm is required in an SI device for high power application having a blocking voltage of 1000 V and blocking gain μ of about 160 to 200.

A breakdown reverse voltage between the gates and the cathodes also depends on depth of formation of the p$^+$-type gate regions 22, i.e., the depth of the trenches 20. When impurity concentration of the n$^-$-type substrate 11 is not more than $1 \times 10^{15}/cm^3$, for example, a breakdown reverse voltage of about 100 V is obtained with depth of the trenches 20 of 7 to 8 μm. In other words, sufficient reverse voltage resistance can be obtained by appropriately setting the depth of the trenches 20.

On the other hand, the width of the trenches 14 relates to resistance of the p$^+$-type gate regions 22, such that 5 to 10 μm is required in an SI device for high power application having large current for extraction from gates when impurity concentration of the p$^+$-type gate regions 22 is $10^{19}$ to $10^{20}/cm^3$. Since the interval between each pair of the trenches 14 is about 10 to 15 μm as hereinabove described, one unit can be formed in width of 15 to 25 μm assuming that one gate region and one cathode region define one unit, thereby to make it at least twice to three times as fine as the conventional SI device shown in FIG. 1, for example.

Description is now made on improvement in electrical property due to formation of the p$^+$-type gate regions 22 of the SI device by thermal diffusion from the doped polysilicon members 15 formed in the n$^-$-type substrate 11 and serving as diffusion sources.

Figure 1:
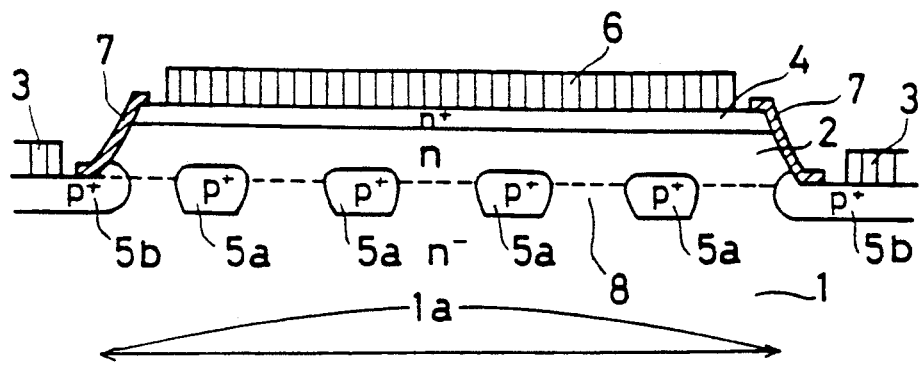
FIG. 1 is a sectional view showing a conventional SI device of buried gate structure.
Figure 2:
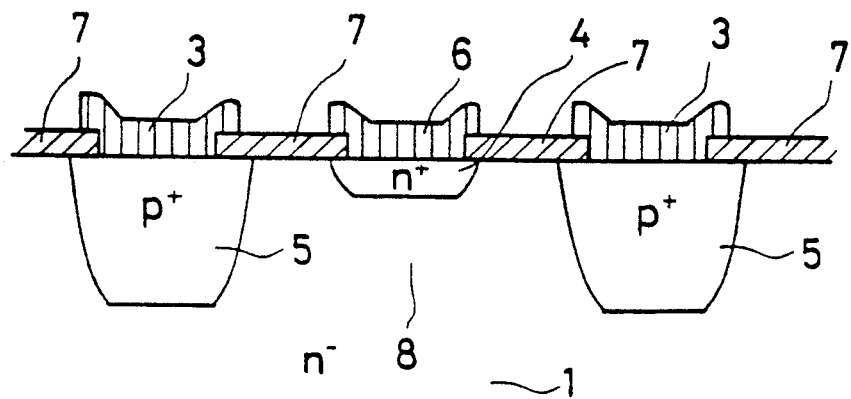
FIG. 2 is a sectional view showing a conventional SI device of surface gate structure.
Figure 3:
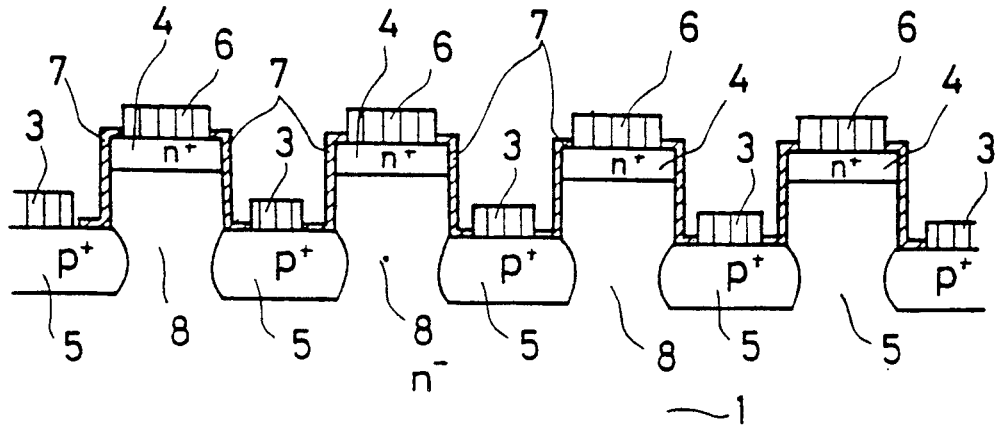
FIG. 3 is a sectional view showing a conventional SI device of trench gate structure.

First, since the entire channel regions can be formed only in the n$^-$-type substrate 11 without using any epitaxial layer, no degradation is caused in impurity concentration profile of the channel regions, dissimilarly to the conventional SI device shown in FIG. 1. As the result, a stable switching property, a sufficient breakdown reverse voltage between the gates and the cathodes and an improved blocking property can be attained in high accuracy.

Further, the doped polysilicon members 15 themselves contain the impurity of high concentration to extremely reduce gate resistance, whereby a high-speed switching property can be attained while excessive minority carriers can be reliably extracted during a turn-off process.

Since the insulating materials 24 are buried in the trenches 20, junction capacity by p-n junction between the gates and the cathodes is reduced effectively for increasing the speed of turn-on/turn-off operation.

The completed SI device, which is flattened by the insulating layer 24, can be employed also as a pressure-contact type device, similarly to the conventional SI device of the buried gate structure shown in FIG. 1.

FIGS. 7A to 7H are sectional views showing a method of manufacturing an SI device according to another embodiment of the present invention. This manufacturing method is now described with reference to these figures.

Figure 7A:
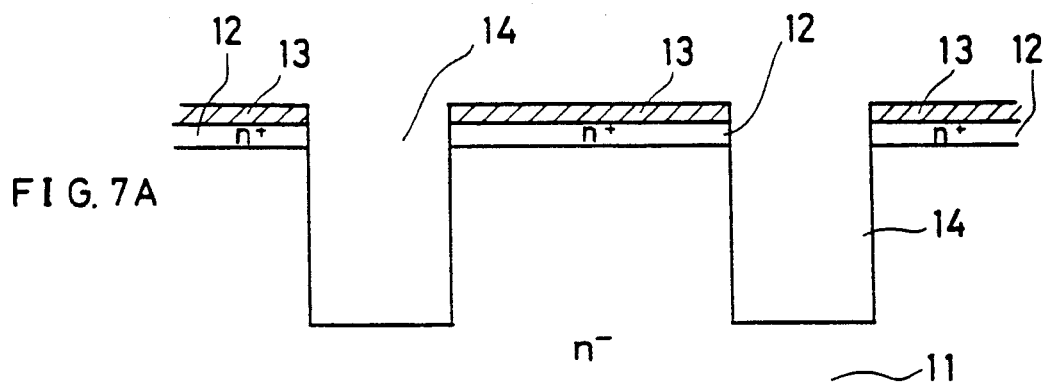
FIGS. 7A to 7H are sectional views showing a method of manufacturing an SI device according to another embodiment of the present invention.

First, an n$^+$-type cathode region 12 is formed over the entire upper surface of an n$^-$-type substrate 11, and an oxide film 13 is formed on the n$^+$-type cathode region 12 by thermal oxidation. Then, a resist film is applied onto the oxide film 13, and thereafter patterned. Then, this resist film is employed as a mask to selectively etch the n$^+$-type cathode region 12 and the oxide film 13, and the patterned oxide film is employed as a mask to anisotropically etch the n$^-$-type substrate 1, thereby to form trenches 14, as shown in FIG. 7A.

Figure 7B:
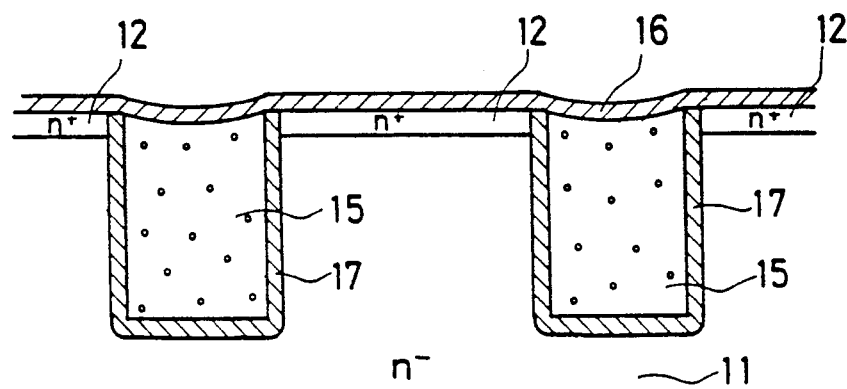

Then, doped polysilicon members 15 containing an impurity of high concentration are buried in the trenches 14, as shown in FIG. 7B. The surface is flattened and thereafter a thermal oxide film 16 is formed over the entire surface of the n$^-$-type substrate 11 including the doped polysilicon members 15. At the same time, p$^+$-type diffusion layers 17 are formed on outer peripheries of the doped polysilicon members 15, by thermal diffusion from the doped polysilicon members 15, which serve as diffusion sources.

Figure 7C:
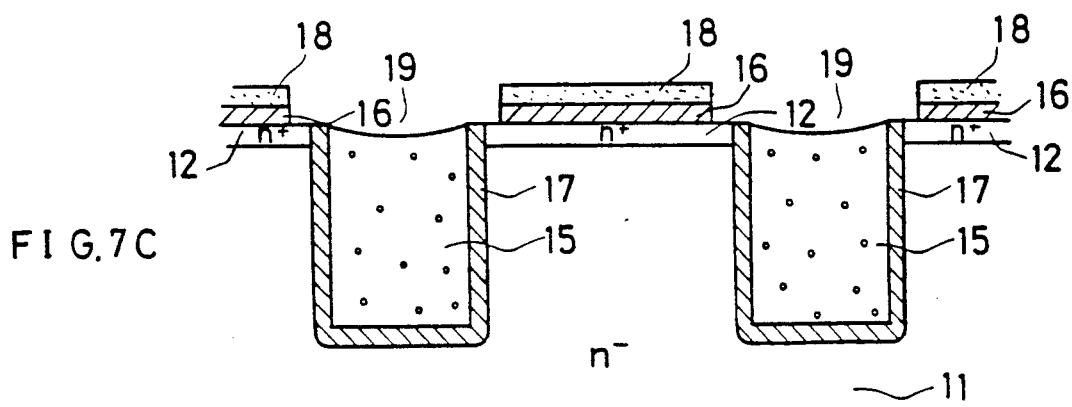

A resist film 18 is applied onto the oxide film 16 to be patterned in regions including upper surfaces of the doped polysilicon members 15 and being wider by 2 to 3 μm. This resist film 18 is employed as a mask to perform etching, thereby to define openings 19, which are wider than the upper surfaces of the doped polysilicon members 15, as shown in FIG. 7C.

Figure 7D:
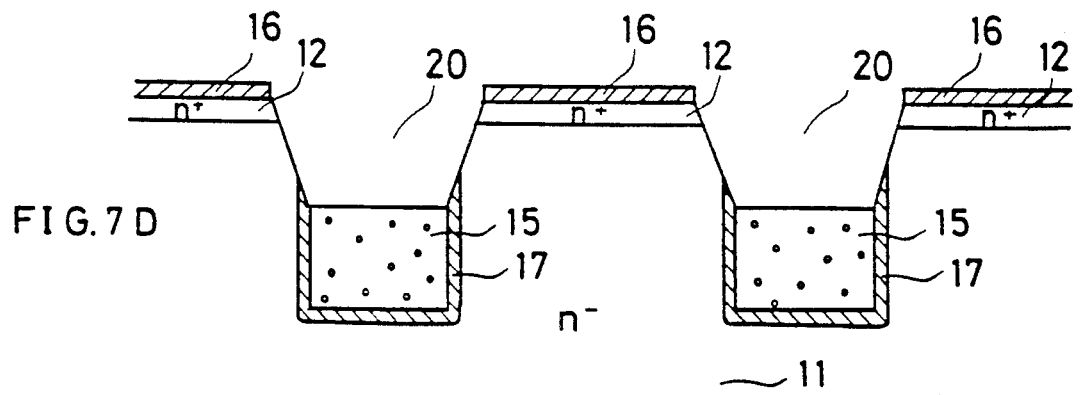

Then patterned oxide film 18 is employed as a mask to perform taper etching on the doped polysilicon members 15, the n$^+$-type cathode region 12 and the p$^+$-type diffusion layers 17, thereby to define trenches 20 having openings larger than the upper surfaces of the doped polysilicon members 15 and bottom portions substantially identical in size to the upper surfaces of the doped polysilicon members 15 and being smaller in width than the trenches 14. As the result, parts of the polysilicon members 15 and the p$^+$-type diffusion layers 17 are substantially removed from the trenches 20, as shown in FIG. 7D.

Figure 7E:
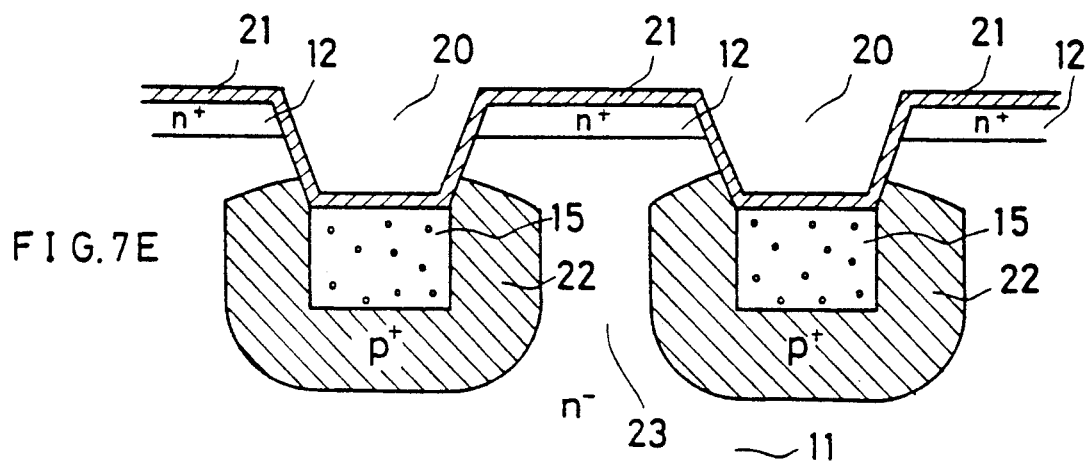

Then, the entire surface of the n$^-$-type substrate 1, including the trenches 20, is covered with an oxide film 21 by thermal oxidation. Further, p$^+$-type gate regions 22 are formed as shown in FIG. 7E through impurity diffusion from the doped polysilicon members 15, serving as diffusion sources, by heat treatment. At the same time, a channel region 23 is formed to have desired channel width and channel length.

Figure 7F:
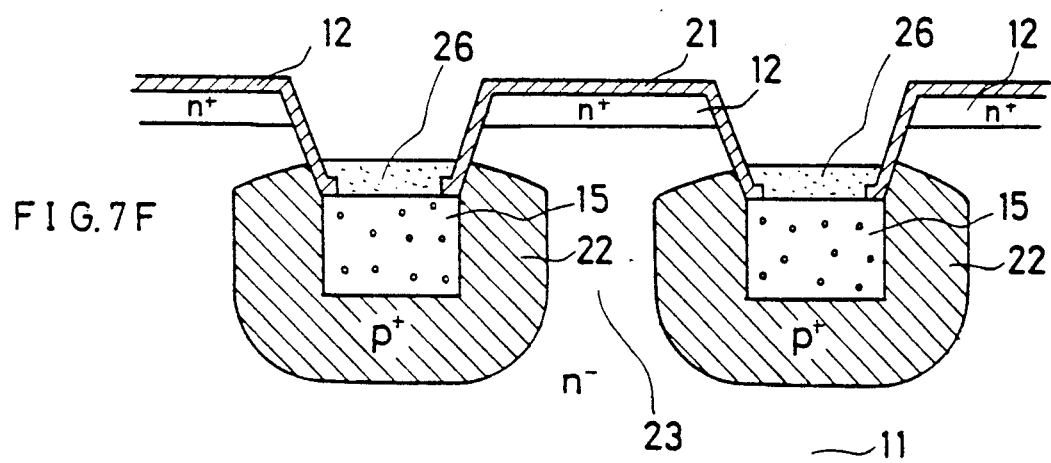

Thereafter the surfaces of the polysilicon members 15 are exposed by etching or the like, to form conductor layers 26 of metal silicide or the like on the exposed parts of the polysilicon members 15, as shown in FIG. 7F. Since the trenches 20 are tapered, the conductor layers 26 can be easily formed on the exposed surfaces of the polysilicon members 15, i.e., the bottom portions of the trenches 20 by performing etching after forming a conductor layer over the entire surface of the n$^-$-type substrate 1 including the trenches 20, etc.

Figure 7G:
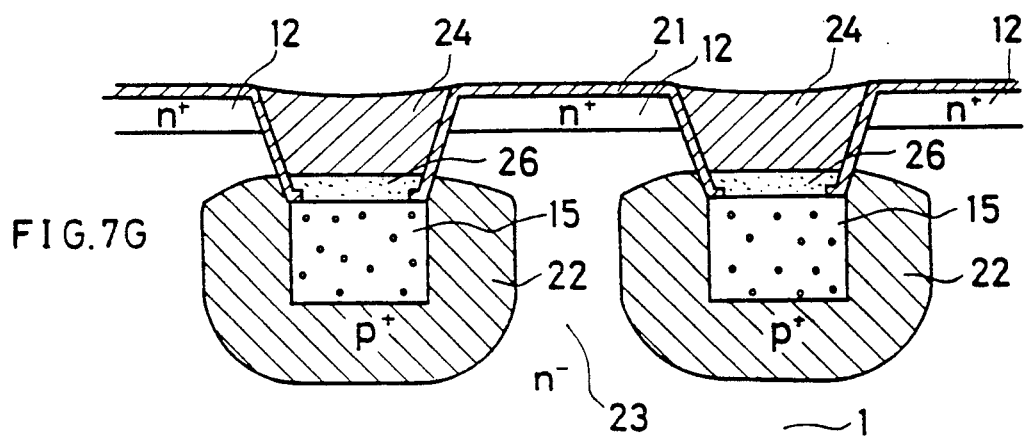
Figure 7H:
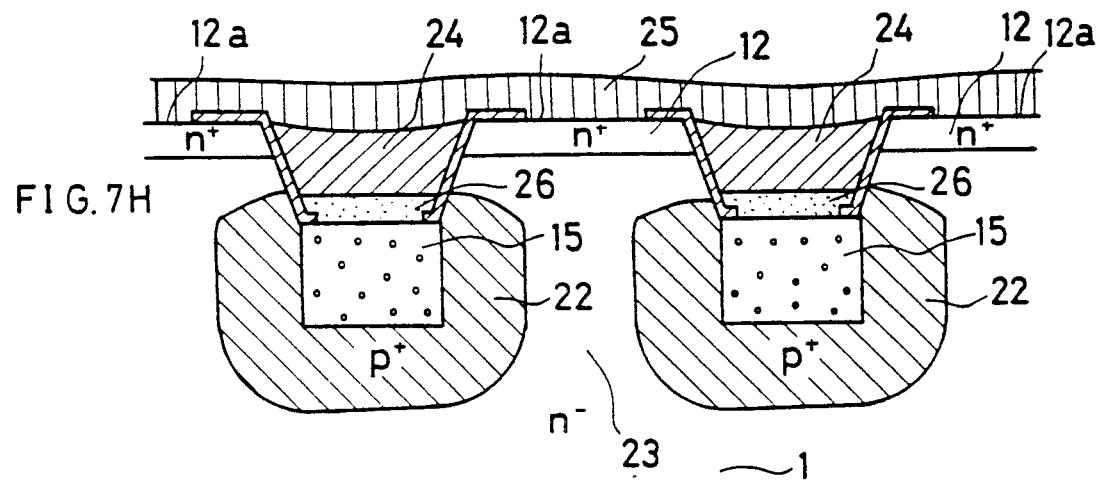

Insulating materials 24 are buried on the conductor layers 26 located in the trenches 20 by CVD or the like, to flatten the surface as shown in FIG. 7G. Parts of the oxide film 21 located on the n$^+$-type cathode region 12 are selectively etched to expose surface parts of the cathode region 12, thereby to define cathode contact regions 12a. Thereafter a cathode metal electrode 25 is formed to be electrically connected with the n$^+$-type cathode region 12 through the cathode contact regions 12a as shown in FIG. 7H. Thus, gate and cathode regions are completed in the SI device according to this embodiment.

This SI device has an effect of further reducing gate resistance, in addition to the effects of the SI device according to the embodiment shown in FIGS. 4 to 6.

Although each embodiment has been described with reference to gate structure of an SI thyristor or an SI transistor, the present invention is also applicable to the gate structure of a junction FET or a permeable base transistor. Throughout the specification, the term "static induction type switching device" includes all types of switching devices, in which current control mechanisms are performed through static induction.

Although each embodiment has been described mainly with reference to an SI device for high power application, the present invention is also applicable to an IC of an SI device for small power, as a matter of course.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A method of manufacturing a static induction type switching device comprising the steps of:

(a) preparing a first conductivity type semiconductor substrate having top and bottom major surfaces;
(b) forming a first conductivity type region on said top major surface of said semiconductor substrate;
(c) selectively removing said first conductivity type region and said semiconductor substrate to thereby define trenches which are arrayed substantially in parallel with said top major surface;
(d) forming polysilicon regions containing second conductivity type impurities in bottom portions of said trenches by providing a material substantially made of polysilicon having a second conductivity impurities into said trenches and removing a top portion of said material from each of said trenches to thereby obtain polysilicon regions;
(e) diffusing said second conductivity type impurities from said polysilicon regions serving as diffusion sources to thereby form diffused regions on peripheries of said polysilicon regions, said diffused regions serving as gate regions with said polysilicon regions; and
(f) forming a first or second conductivity type second main electrode region on said bottom major surface of said semiconductor substrate.

* * * * *